United States Patent [19]

Oota et al.

[11] 4,412,481

[45] Nov. 1, 1983

[54] COFFEE MAKER

[75] Inventors: Hiroyuki Oota, Iwakura; Ryuuho Narita, Nagoya, both of Japan

[73] Assignee: Tokyo Shibaura Denki Kabushiki Kaisha, Kawasaki, Japan

[21] Appl. No.: 340,634

[22] Filed: Jan. 19, 1982

[30] Foreign Application Priority Data

| | | | |
|---|---|---|---|
| Jan. 22, 1981 | [JP] | Japan | 56-8194 |
| Jan. 23, 1981 | [JP] | Japan | 56-9431 |
| Jan. 23, 1981 | [JP] | Japan | 56-9432 |
| Jan. 23, 1981 | [JP] | Japan | 56-9433 |
| Jan. 23, 1981 | [JP] | Japan | 56-9434 |

[51] Int. Cl.³ .......................................... A47J 31/42
[52] U.S. Cl. ....................................... 99/280; 99/281; 99/285; 99/286; 219/328
[58] Field of Search ............... 99/280, 281, 282, 284, 99/285, 288, 298, 300, 304, 307, 283; 307/141.4, 141.8; 318/484; 219/297, 302, 328, 327, 303, 296

[56] References Cited

U.S. PATENT DOCUMENTS

| | | | |
|---|---|---|---|
| 2,868,109 | 1/1959 | Davis | 99/286 |
| 4,133,256 | 1/1979 | Lamour | 99/280 |
| 4,196,658 | 4/1980 | Takagi | 99/286 |
| 4,223,379 | 9/1980 | Simcoe | 307/141.4 |
| 4,242,568 | 12/1980 | Wunderlin | 99/280 |
| 4,328,539 | 5/1982 | Heeger | 307/141.4 |

*Primary Examiner*—Robert W. Jenkins
*Attorney, Agent, or Firm*—Cushman, Darby & Cushman

[57] ABSTRACT

An AC power source is coupled with a heater circuit containing a series circuit including a cover switch for a coffee maker, a thermal switch for controlling the temperature of a heating unit and a control switch for turning on and off a heater of the heating unit. A detecting circuit is connected between a signal take-out node as a juction point between the heater and the thermal switch and one end of the AC power source. The detecting circuit responds to a given on-off states of each of the switches to receive a detection current from the signal take-out node, and produces a detection signal for controlling a control apparatus for the coffee maker.

20 Claims, 2 Drawing Figures

COFFEE MAKER

BACKGROUND OF THE INVENTION

The present invention relates to a coffee maker and, more particularly to a control apparatus for a coffee maker with a detecting circuit for detecting on and off states of a main switch for a mill mechanism, a thermal switch for regulating temperature of a heating unit in a drip mechanism and a heater switch of the heating unit.

For a better understanding of the present invention, the conventional combination type coffee maker will be briefly described. The combination type coffee maker to which the invention may be applied is provided with a mill mechanism and a drip mechanism as disclosed in U.S. Pat. No. 4,196,658 issued to Takagi et al on Apr. 8, 1980, which is assigned to the same assignee as of the present application. In the mill mechanism, a cutter is provided in a case containing coffee beans and is driven by a motor to mill coffee beans into coffee powder. The drip mechanism pours hot water into the coffee powder in the case to make coffee. A heating unit for boiling water and keeping coffee warm is installed in the drip mechanism and contains a heater. Some mill mechanisms for the conventional coffee maker employ a spring-driven timer for setting a drive time of the motor. It is desirable to set the drive time, or the milling time so accurate that the coffee maker may serve coffee with preferable density. The case has a cover for preventing coffee beans from scattering outside the case when the coffee beans are milled. To this end, a cover switch is used for shutting off the current path to the motor for driving the cutter, when the cover is open. In addition, the conventional coffee maker is provided with a thermal switch which turns off when the temperature of the heating unit exceeds a predetermined value, and a heater switch for controlling on and off of the heater. The on and off states of the cover switch, the thermal switch, and the heater control switch must be detected for automatically operating the control apparatus for the coffee maker. To realize this end, an approach might be allowed in which the on and off states of these switches are indivisually controlled. However, this approach makes the control apparatus extremely complicated and hence is unpractical.

SUMMARY OF THE INVENTION

Accordingly, an object of the present invention is to provide a coffee maker including a detecting circuit for detecting the on and off states of switches in a heater circuit having a series circuit of a main switch (e.g. a cover switch), a heater, a heater control switch which is turned on after the main switch is turned on, and a thermal switch for regulating the temperature of a heating unit in a drip mechanism.

According to the present invention, there is provided a coffee maker which comprises a mill mechanism for milling coffee beans into coffee powder, the mill mechanism including a case for containing the coffee beans, a cutter disposed in said case, and a motor coupled to the cutter; a drip mechanism for pouring hot water into the coffee powder in the case, the drip mechanism including an electric heater; switching means for controlling the energization of the heater, the switching means including a main switch, a thermal switch for sensing the temperature of the heater, and a heater switch, the main switch, the heater of the drip mechanism, the thermal switch, and the heater switch constituting a series circuit connected with a power source; means for generating a reference pulse, first counter means for counting the reference pulse and storing a mill time data for the mill mechanism; setting means for providing the first counter means with the reference signal so as to set the mill time data in the first counter means; second counter means for counting the reference pulse during a period of time corresponding to the mill time data; operation start means for providing an operation start signal; means for detecting the on-off states of the main switch and the thermal switch; transfer gate means for transferring the mill time data stored in the first counter means to the second counter means in response to the operation start signal unless the detecting means detects the off-state of the main switch; means for driving the motor in response to the output signal of the second counter means; means for controlling the on-off states of the heater switch in response to the output signals of the second counter means and the transfer gate means; and means for signalling termination of the drip operation of the drip mechanism in response to the output signal of the detecting means which indicates that said thermal switch of the switching means has sensed a predetermined temperature of the heater.

DETAILED DESCRIPTION OF THE PREFERRED EMBODIMENTS

An embodiment according to the present invention may be applied to a combination type coffee maker which comprises a mill mechanism and a drip mechanism as disclosed in U.S. Pat. No. 4,196,658, for example. The mill mechanism includes a cutter in a case containing coffee beans and a motor for driving the cutter. The cutter is driven by the motor to mill the coffee beans into coffee powder. The drip mechanism includes a heating unit for boiling water and keeping coffee warm, and a pipe assembly connected at one end to a water reservoir tank and for pouring hot water boiled by the heating unit into the case from the other end. A cover is detachably placed over the upper opening of the case to prevent coffee beans from scattering outside the case during the milling operation period and an inlet is formed in the central portion of the cover to receive hot water during the drip operation period.

Figure 1:
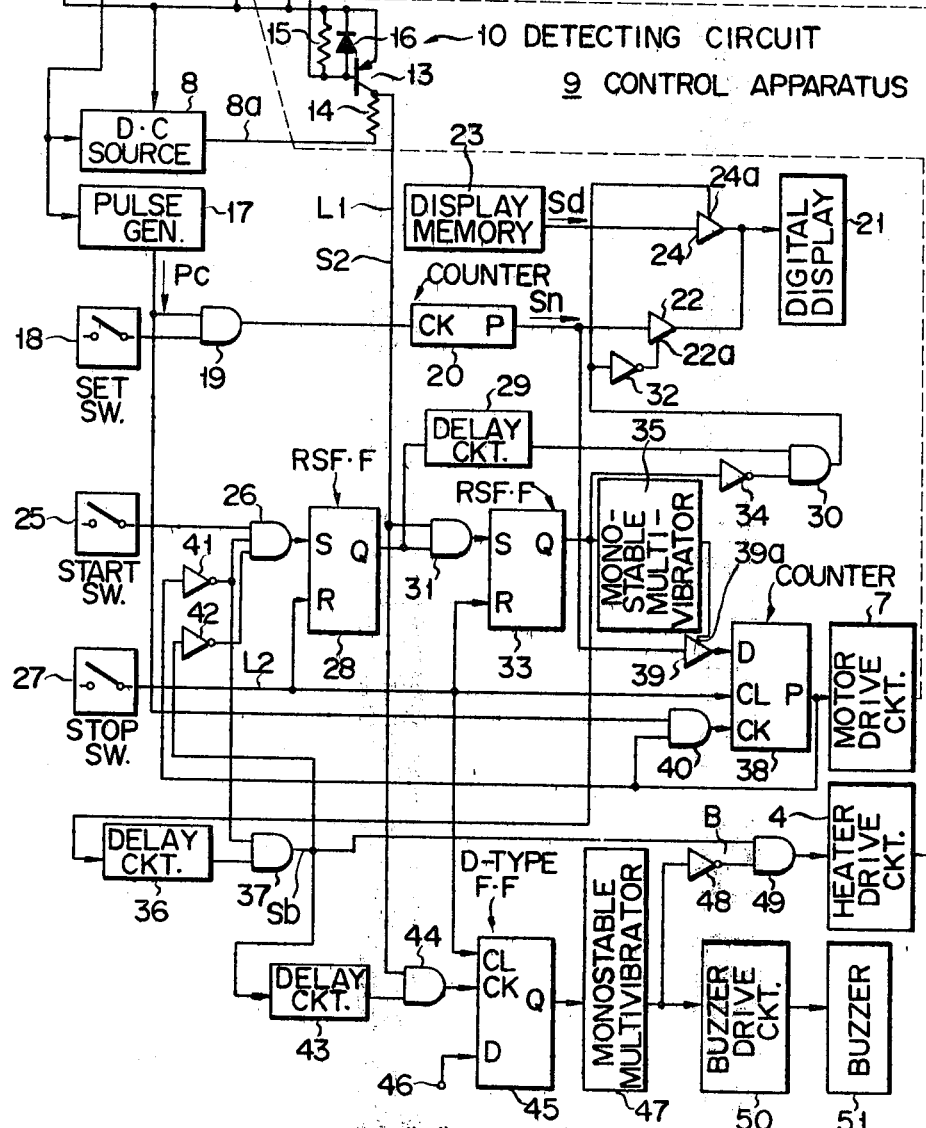
FIG. 1 is a block diagram of an embodiment of a coffee maker according to the present invention.

In FIG. 1, reference numeral 1 designates a main switch, for example, a cover switch. The cover switch is turned on only when the cover (not shown) is set in a normal position. A heater 2 is contained in a drip mechanism 100. A thermal switch 3 is a normally closed switch of the bimetal type, for example, which is turned off when the heating unit is heated to exceed a predetermined temperature. A heater control switch 4a controls the on and off of a heater 2. A series circuit including the cover switch 1, the heater 2, the bimetal switch 3 and the heater control switch 4a (an output switch of a heater drive circuit 4 to be described later) makes up a heater circuit A. The heater circuit A is connected between both output terminals 5a and 5b of an AC power source 5 which is connected to one end to ground. Another series circuit including a mill mechanism drive motor 6 for a mill 102 with cutter 104 in a case 106 and an output switch 7a of a motor drive circuit 7 to be described later is connected across the heater circuit A. A DC power source 8 comprises a rectifier for rectifying an output voltage from the AC power source 5 to provide a predetermined power to selected circuits of a control apparatus 9. In the figure, only a lower potential (reference potential) output line 8a of the D.C source is illustrated. A detecting circuit 10 constitutes an on-off state judging circuit for switches included in the heating circuit A and will be described in detail. A junction between the heater 2 and the bimetal switch 3 in the heater circuit A is a signal take-out node 11 which is connected to the base electrode of a PNP transistor 13 in the detecting circuit 10 through a resistor 12. The emitter electrode of the transistor 13 is connected to an output terminal 5b of the AC power source 5, and the collector electrode of the transistor 13 is connected to the lower potential output line 8a of the DC power source 8 through a resistor 14. A parallel circuit of a resistor 15 and a diode 16 is connected between the base and emitter electrodes of the transistor 13. The collector of the transistor 13, serving as an output terminal electrode of the detecting circuit 10 is connected to a line L1.

Figure 2:
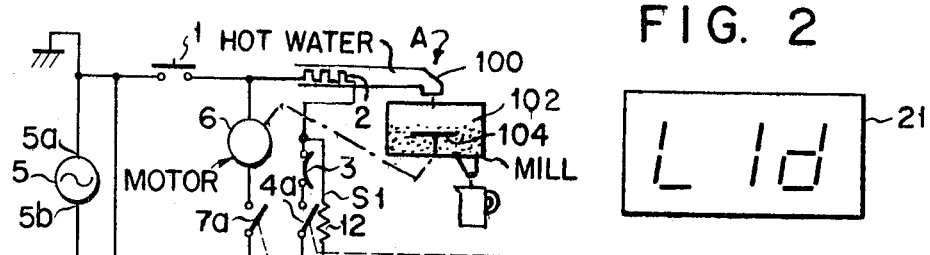
FIG. 2 illustrates an example of displays by a digital display unit shown in FIG. 1.

The construction of the control apparatus 9 will be described. The control apparatus 9 may be comprised of a microcomputer such as "TMS-1040B" manufactured by Texas Instruments, Inc., but there is shown a combination of electronic circuits, for simplicity. A pulse oscillator 17, providing count pulses in synchronism with the frequency of AC power source 5, produces count pulses Pc of 1 Hz. The control apparatus 9 includes a set switch 18, a start switch 25, and a stop switch 27 which are manually operated switches and disposed on a operation pannel (not shown) in the coffee maker. The switch 18 is used for setting a mill time of the mill mechanism. When the switch 18 is turned on, it produces a high level signal to be supplied to one of the input terminals of an AND circuit 19. The AND circuit 19 is so connected as to receive the count pulses Pc at the other input terminal from the pulse generator 17. The AND circuit 19 permits the count pulse Pc to pass therethrough only duing the ON period of the switch 18. A 16-scale up-counter 20 (referred to as a first counter) receives at the clock input terminal CK the count pulses Pc from the AND circuit 19 and counts up the count pulses to produce the count result as a digital signal Sn. A three-digit digital display unit 21, each digit of which contains 7 segments light emitting diodes, receives the digital signal Sn through a transfer gate 22 to display a numeral (2 digits maximum) corresponding to the digital data Sn. The transfer gate 22 exhibits a low impedance to allow the input signal to pass therethrough only when receiving a high level signal at the control terminal 22a. The remaining transfer gates 24 and 39 used in this embodiment have the same contruction as that of the transfer gate 22. A display memory 23 stores display data Sd such as "LID", for example. The data Sd is transferred to the digital display unit 21 when the transfer gate 24 is conductive. When the data Sd is transferred to the digital display unit 21, the digital display unit 21 displays "LId", as shown in FIG. 2. A start switch 25 is provided for intiation of the mill-time counting operation. When the switch 25 is turned on, a high level signal appears at one of the input terminals of a three-input AND circuit 26. A stop switch 27 is used for termination of the coffee making sequence. When the switch 27 is turned on, a high level signal appears on a line L2. An R-S flip-flop 28 is connected at the set terminal S to the output terminal of the AND circuit 26 and at the reset terminal R to the line L2. An output signal from the set output terminal Q of the flip-flop circuit 28 is applied to one of the input terminals of an AND circuit 30 through a delay circuit 29 and is directly applied to one of the input terminals of an AND circuit 31. The other input terminal of the AND circuit 31 is coupled with the line L1. A delay time of the delay circuit 29 is set at 20 ms (millisecond) or so, for example. An output terminal of the AND circuit 30 located at the post stage of the delay circuit 29 is connected to the control terminal 22a of the transfer gate 22, through an inverter 32, and is directly applied to the control terminal 24a of the transfer gate 24. With such a connection, the transfer gate 22 is conductive when the AND circuit 30 produces a low level signal, while the transfer gate 24 is conductive when the AND circuit 30 produces a high level signal. An R-S flip-flop circuit 33 is connected at the set input terminal S to the output terminal of the AND circuit 31 and at the reset input terminal R to the line L2. An output signal from the set output terminal Q of the flip-flop circuit 33 is applied to the other input terminal of the AND circuit 30 through an inverter 34. The second set output signal from the flip-flop circuit 33 is directly applied to a monostable multivibrator 35 which produces a high level signal for a short time when it receives a positive going signal, and is applied through a delay circuit 36 to one of the input terminals of an AND circuit 37. Reference numeral 38 designates a down-counter (or a second counter) with preset and clear functions. When the digital data Sn is applied from the up-counter 20 to the data input terminal D of the counter 38 through the transfer gate 39, the data Sn is preset in the counter 38. Every time the count pulse Pc is applied to the clock input terminal CK, the count pulse Pc is subtracted (or counted down) from the preset value. When a high level signal is provided to the clear terminal CL, the contents of the counter are cleared to "0". The down-counter 38 produces a high level signal at the P terminal during only the period except when the count is "0". The high level signal is supplied to the motor drive circuit 7. The motor drive circuit 7 turns on the output switch 7a in response to the high level input signal. The data input terminal D of the down-counter 38 is connected to the output terminal D of the up-counter 20 through the transfer gate 39, the clock input terminal CK is connected to the output terminal of the AND circuit 40 and the clear input terminal CL is connected to the line L2. The AND circuit 40 receives the count pulse Pc at the input terminal and is connected at the other input terminal to the output terminal P of the down-counter 38. The control terminal 39a of the transfer gate 39 receives an output signal from the monostable multivibrator 35. The output terminal P of the down-counter 38 is also coupled to an inverter 41 of which the outputs are connected to the input terminals of the AND circuits 26 and 37, respectively. The remaining input terminal of the AND circuit 26 is connected to the output terminal of the AND circuit 37 through the inverter 42. The output terminal of the AND circuit 37 is connected to one of the input terminals of an AND circuit 44 through a delay circuit 43 with a delay time of 10 ms, for example. The other input terminal of the AND circuit 44 is connected to the line L1. A D-flip-flop 45 is connected at the data input terminal D to a high level signal terminal 46, at the clear input terminal CL to the line L2, and at the clock input terminal CK to the output terminal of the AND circuit 44. A monostable multivibrator (or a timer circuit) 47 produces a high level signal only for a predetermined period when the output signal from the D-flip-flop 45 goes high in level. The output signal from the D-flip-flop 45 is applied to one of the input terminals of an AND circuit 49 through an inverter 48, and is directly applied to alarm (buzzer) drive circuit 50. The inverter 48 and the AND circuit 49 make up a buzzer stop circuit B for terminating the operation of the heater drive circuit 4 so as to stop energizing heater 2 when the buzzer 51 is sounding. The buzzer drive circuit 50 drives the buzzer 51 to signal the end of the coffee brewing only when receiving the high level signal. The AND circuit 49 is connected at the output to the heater drive circuit 4 which turns on the output switch 4a when it receives the high level signal. The other input terminal of the AND circuit 49 is connected to the output terminal of the AND circuit 37.

The operation of the above-mentioned embodiment thus constructed will be described. For extracting coffee, an amount of water corresponding to a desired number of persons is supplied to the reservoir tank in the drip mechanism. Coffee beans corresponding to the number of persons is put into the case, and then the cover is set on the case. Further, a bottle for holding brewed coffee is placed on the heating unit in the drip mechanism. In this case, when the set switch 18 is turned on and its ON state is kept, the count pulse Pc is applied from the count pulse generator 17 to the up-counter 20 through the AND circuit 19. Upon receipt of the count pulse Pc, the counter 20 counts up the count pulse Pc to produce a digital data Sn. At this time, as will be seen later, the AND circuit 30 has produced a low level signal and the transfer gate 22 has been conductive. Accordingly, the digital display unit 21 receives the digital data Sn and displays increasing numerals corresponding to the increasing digital data such as "0", "1", "2", "3", . . . . While observing the increasing numerals displayed, an operator turns off the set switch 18 when the display unit 21 displays a numeral "12", for example. When the ON state of the set switch 18 is released, no high level signal is applied from the set switch 18 to the AND circuit 19 and the AND circuit 19 blocks the passage of the count pulse Pc. As a result, the up-counter 20 stops its counting operation and stores the counted value of "12", and produces a digital data Sn corresponding to the value of "12". At this time, the digital display unit 21 is left displaying the numeral "12". Afterward, the start switch 25 is turned on to produce an operation start signal. In this case, since the inverters 41 and 42 have produced high level signals, the AND circuit 26 applies the operation start signal to the set input terminal S of the R-S flip-flop circuit 28. Accordingly, the R-S flip-flop circuit 28 is set to produce a high level signal at the set output terminal Q. Under this condition, if the case cover is incorrectly set so that the cover switch 1 is in an OFF state, and the output switch 4a is in an OFF state, then no base current S of the detecting circuit 10 is applied from the signal take-out node 11 to the base of the transistor 13 and the transistor 13 is in an OFF state. Accordingly, the line L1 carries a low level signal corresponding to a potential on the lower potential output line 8a of the DC power source 8, and the AND circuit 31 is left producing the low level signal. As a result, the R-S flip-flop circuit 33 keeps its reset state, while producing at the set output terminal Q the low level signal. Aa described above, when the R-S flip-flop circuit 28 produces a high level signal, the high level signal is applied to one of the input terminals of the AND circuit 30 through the delay circuit 29. At this time, the low level signal from the R-S flip-flop circuit 33 is applied through the inverter 34 to the other input terminal of the AND circuit 30. When the cover switch 1 is OFF, the AND circuit 30, therefore, produces a high level signal to render the transfer gate 24 conductive. Then, the display data Sd from the display memory 23 is transferred to the digital display unit 21 which in turn displays "LID" (see FIG. 2), thus signaling that the cover is incorrectly set. When the start switch 25 is turned on while the cover is incorrectly set, no high level signal is produced from the R-S flip-flop circuit 33 and the monostable multivibrator 35 is not driven, so that the transfer gate 39 keeps the nonconductive state. No digital signal Sn from the up-counter 20 is inputted to the data input terminal D of the down-counter 38. The down-counter 38 is in the initial state, i.e. "0" count, while continuously producing a low level signal. Accordingly, the output switch 7a is not turned on by the motor drive circuit 7 and hence the nonconductive state of the motor 6 is kept. In other words, when the case cover is uncorrectly set, the milling operation is never started. On the other hand, when the case cover is set at the predetermined position so that the cover switch 1 is turned on, and the output switch 4a is OFF, the base current is fed from the signal take-out node 11 to the transistor 13 every half period when the output terminal 5b of the AC power source 5 is high in level. As a result, the transistor 13 is periodically turned on in accordance with the frequency of the AC power source 5. Therefore, a high level signal (the detection signal S2) intermittently appears on the line L1 every time the transistor 13 is turned on. However, even if the cover is incorrectly set after the start switch 25 is turned on, an operator can set the cover in the correct position after seeing the display "LId" by the display unit 21. In those situations, the R-S flip-flop circuit 33 is set to produce a high level signal at the output terminal Q. Then, the monostable multivibrator 35 driven by the high level signal produces a high level signal for a short time to render the transfer gate 39 conductive. The digital data Sn (representing a set time of the milling operation) stored in the up-counter 20 is applied to the data input terminal D of the down-counter 38. Upon receipt of the digital signal, the down-counter 38 presets therein a numeral "12" corresponding to the digital data Sn, while at the same time produces at the output terminal P a high level signal to operate the motor drive circuit 7. As a result, the output switch 7a is turned on to feed current to the motor 6, so that the cutter is rotated to mill the coffee beans in the case into coffee powder. Simultaneously with the start of the cutter, a high level signal is applied to one of the input terminals of the AND circuit 40, and hence the count pulse Pc applied to the other input terminal of the AND circuit 40 is allowed to pass the AND circuit 40. Upon receipt of the count pulse Pc at the clock input terminal CK, the down counter 38 starts the down-count operation. In the down-count operation, the counter 38 counts down the preset value "12" one by one such as "12", "11", "10", . . . . When the count of the down-counter 38 becomes "0", the down counter 38 produces at the output terminal P a low level signal in place of the high level signal. Then, the motor drive circuit 7 stops its operation and turns off the output switch 7a. Consequently, the power supply to motor 6 is stopped and the operation of milling the coffee beans is also stopped. At the end of the milling operation, the AND circuit 40 is disabled and stops the supply of the count pulses Pc to the down-counter 38. A period of time taken for the down-counter 38 to counts down from the count "12" to "0" is 12 seconds since the frequency of the count pulse Pc is 1 Hz. Therefore, the time for milling the coffee beans (milling time) is controlled to be 12 seconds. When a high level signal is produced from the output terminal Q of the flip-flop circuit 33, the high level signal is inverted by the inverter 34 and applied to the AND circuit 30 so that the AND circuit 30 produces a low level signal which in turn is inverted to a high level signal by the inverter 32. The transfer gate 22 is rendered conductive in response to the high level signal supplied to its control terminal 22a and the digital display unit 12 displays the numeral "12" corresponding to the digital data Sn transferred from the up-counter 20 through the gate 22. Before the ON operation of the start switch 25, the R-S flip-flop circuit 28, which is in a reset state, produces a low level signal. Accordingly, the AND circuit 30, which receives the low level signal through the delay circuit 29, produces a low level signal, as mentioned above. The delay circuit 29 is provided for compensating the input of the AND circuit 30 for a time lag owing to the high level signal S2 since the signal S2 is produced intermittently on the line L1.

Following the milling operation, the operation of the control circuit shifts to the drip operation. When the down-counter 38 produces a low level signal to terminate the milling operation, the inverter 41 responds to the low level signal to produce a high level signal. The high level signal produced is applied to one of the input terminals of the AND circuit 37. At a time point that the flip-flop circuit 33 produces a high level signal, that is, the milling operation starts, the AND circuit 37 has received at the other input terminal the high level signal through the delay circuit 36. As a result, the AND circuit 37 produces a high level signal in place of the low level signal which has been produced till then at the time of the end of the milling operation. The high level signal from the AND circuit 37 is referred to as a heating operation start signal Sb. The heating operation start signal Sb instructs the heater drive circuit 4 to start the heating operation, after the milling operation is completed. The heating operation start signal Sb is applied to one of the input terminals of the AND circuit 44 through the delay circuit 43 and is directly applied to the other input terminal of the AND circuit 49. At an instant that the heating operation start signal Sb is produced from the AND circuit 37, a low level signal is applied to one (corresponding to the input terminal connected to the delay circuit 43) of the input terminals of the AND circuit 44, so that the AND circuit 44 produces a low level signal. The D-flip-flop 45 is in the initial state (clear state), while producing at the output terminal Q a low level signal. The monostable multivibrator 47 is not in a driven state either while producing a low level signal. The inverter 48, which receives the low level signal, produces a high level signal. Accordingly, the instant the AND circuit 37 produces the heating operation start signal Sb, the AND circuit 49 produces a high level signal. Therefore, the heater drive circuit 4 is driven to turn on the output switch 4a and to energize the heater 2. When the output switch 4a is turned on, no base current is supplied from the signal take-out node 11 to the base of the transistor 13 of the detecting circuit 10, and the transistor 13 is not turned on. As a result, a low level signal is applied to the line L1, so that a low level signal is applied to the in-put terminal of the AND circuit 44. A delay time of the delay circuit 43 is about 10 ms, and longer than a delay time from an instance that the output switch 4a of the heater drive circuit 4 is turned on until the low level signal is outputted to the line L1. At a time point that the heating operation start signal Sb is supplied from the AND circuit 37, the delay circuit 43 prevents that a high level signal is applied to the input terminals of the AND circuit 44. The D-flip-flop circuit 45 is kept in its initial state. When the heater 2 is energized, the water in the heating unit supplied from the reservoir tank is heated to be boiled. The boiled water is fed, by the boiling pressure, to the case to brew the coffee through the inlet of the cover. The coffee is put into the bottle placed on the heating unit of the drip mechanism. When the water is completely consumed through the coffee extraction, or the dripping operation, no heat exchange takes place between the heating unit and the water, so that the temperature of the heater rises. The bimetal switch 3 senses the temperature rise and turns off at a predetermined temperature in order to shut off the heater 2 from the energization. At this point, the drip operation completes. Upon the completion of the drip operation, that is, turning off the bimetal switch, the base current is fed again from the signal take-out node 11 to the base of the transistor 13. The transistor 13 is again turned on, so that a high level signal intermittently appears on the line L1. Then, a high level signal is applied to the input terminal of the AND circuit 44, so that the AND circuit 44 produces a high level signal and the D-flip-flop circuit 45 is triggered to produce a high level output signal. In response to the output signal, the monostable multivibrator 47 produces a high level signal during a given period. The buzzer drive circuit 50 receives the high level signal and drives the buzzer 51 so as to signal the completion of the dripping operation. During the period that the buzzer 51 is sounding, that is, a high level signal is produced from the monostable multivibrator 47, the high level signal is inverted into the low level signal by the inverter 48 and the low level signal is supplied to the AND circuit 49 which in turn produces a low level signal. As a result, the drive operation of the heater drive circuit 4 is temporarily stopped. After the completion of the drippling operation, the bimetal switch is intermittently turned on and off to control the current feed to the heater 2. In this way, the heating unit keeps warmth of the coffee in the bottle. For stopping warmth of the coffee, the stop switch 27 is operated. A high level signal produced on the line L2 by turning on the stop switch, resets or clears all the R-S flip-flop circuits 28 and 33, the down counter 38, and the D-flip-flop 45. Particularly, the reset of the R-S flip-flop 33 provides a low level signal to the AND circuit 37 and the AND circuit 49 at the post stage of the AND circuit 37 produces a low level signal. As a result, the operation of the heater drive circuit 4 is stopped and the on-off of the heater, i.e. the operation of keeping warmth, is stopped. If the stop switch 27 is turned on during the dripping operation, the current supply to the heater 2 is stopped, so that the drip operation is discontinued. When, during the mill operation, the stop switch 27 is turned on, the count of the down-counter 8 is cleared to "0" to produce a low level signal. Accordingly, the operation of the motor drive circuit 7 is stopped to shut off the current supply to the motor 7. In this way, the milling operation is discontinued. The delay circuit 36 (the first delay circuit) is provided in order to prevent the operation start signal Sb from being produced in a manner that a high level signal is applied to both input terminals of the AND circuit 37 at an instant that the milling operation starts, that is, the R-S flip-flop 33 produces a high level signal.

The delay circuit 43 functions as a timing circuit. A slight time is inevitably taken from an instant that the drip operation starts, that is, the AND circuit 37 produces the operation start signal Sb, till the output switch 4a of the heater drive circuit 4 is turned on. In the case of the relay for the heater drive circuit 4, the time delay is several ms. Assume that the delay circuit 43 is not provided. At the instant that the operation start signal Sb is produced from the AND circuit 37, the output switch 4a is still ON and the detection signal S2 (intermittent high level signal) is produced on the line L1. For this reason, the detection signal S2 and the operation start signal Sb are simultaneously applied to both the input terminals of the AND circuit 44. Accordingly, the AND circuit 44 produces a high level signal which in turn triggers the D-flip-flop 45 to erroneously sound the buzzer 51. Once the D-flip-flop 45 is triggered, it hold its state even it recives at the input terminal CK a high level signal, so that when the drip operation is completed, the monostable multivibrator 47 is not driven. Consequently, the buzzer 51 is not driven to sound. This is a serious problem. To cope with this problem, in the present embodiment, the delay circuit 43 is inserted in the signal transmission path between the AND circuits 37 and 44. The delay time of the delay circuit 43 is set at 10 ms, which is longer than the time from an instant that the operation start signal Sb is outputted from the AND circuit 37 till the output switch 4a is turned on and the low level signal is outputted on the line L1. Therefore, the delay of the delay circuit 43 prevents the detection signal S2 and the operation start signal Sb from simultaneously being applied to both the input terminals of the AND circuit 44 at the time that the AND circuit 37 produces the operation start signal Sb. The erroneous operation of the buzzer 51 can be prevented.

The major features of the control circuit shown in FIG. 1 may be summarized as follows. The detecting circuit 10 senses ON-OFF states of a plurality of the switches to produce the detection signal S2. The detection signal S2 indicates that the main switch is OFF when it is OFF and prevents the data in the first counter 20 from being set in the second counter 38. Therefore, the mill mechanism is not operated so long as the main switch 1 is OFF. Further, the sensing signal is used for starting the milling operation and the dripping operation after the milling operation is completed, and for issuing an alarm after the dripping operation is completed. By using the detecting circuit 10, the control apparatus 9 may readily be modified in accordance with a desired object. It is evident that the present invention is not limited to the circuit shown in FIG. 1 but may be modified variously within the scope of the present invention.

What we claim is:
1. A coffee maker comprising:
   a mill mechanism for milling coffee beans into coffee powder, said mill mechanism including a case for containing the coffee beans, a cutter disposed in said case, and a motor coupled to said cutter;
   a drip mechanism for pouring hot water into the coffee powder in said case, said drip mechanism including an electric heater;
   switching means for controlling the energization of said heater, said switching means including a main switch, a thermal switch for sensing the temperature of said heater, and a heater switch, said main switch, said heater of said drip mechanism, said thermal switch, and said heater switch constituting a series circuit connected with a power source;
   means for generating a reference pulse;
   first counter means for counting the reference pulse and storing a mill time data for said mill mechanism;
   setting means for providing said first counter means with the reference signal so as to set the mill time data in said first counter means;
   second counter means for counting the reference pulse during a period of time corresponding to the mill time data;
   operation start means for providing an operation start signal;
   means for detecting the on-off states of said main switch and said thermal switch;
   transfer gate means for transferring the mill time data stored in said first counter means to said second counter means in response to the operation start signal unless said detecting means detects the off-state of said main switch;
   means for driving said motor in response to the output signal of said second counter means;
   means for controlling the on-off states of said heater switch in response to the output signals of said second counter means and said transfer gate means; and
   means for signalling termination of the drip operation of said drip mechanism in response to the output signal of said detecting means which indicates that said thermal switch of said switching means has sensed a predetermined temperature of said heater.

2. The coffee maker according to claim 1, wherein said detecting means includes a transistor circuit connected with a signal take-out node of said series circuit so that said transistor circuit provides said transfer gate means and said signaling means with an output signal indicative of the on-off states of said main switch and said terminal switch.

3. The coffee maker according to claim 2, wherein said transistor circuit includes a transistor, the first electrode of said transistor being coupled to the signal take-out node of said series circuit, the signal take-out node being connected with a reference potential and one end of said power source through said heater and said main switch while being connected with the other end of said power source through said thermal switch and said heater switch, the second electrode of said transistor being coupled to the other end of said power source, the third electrode of said transistor being coupled to said transfer gate means and said signaling means.

4. The coffee maker according to claim 3, further comprising a D.C. power source for supplying said transistor with a D.C. bias voltage, wherein said power source connected with said series circuit is an A.C. power source, said transistor circuit turns off when no signal from the signal take-out node is fed to the first electrode of said transistor so that said transfer gate means prevents the mill time data stored in said first counter means from being transferred to said second counter means.

5. The coffee maker according to claim 1, wherein said setting means includes a set switch for providing an enabling signal and a gate circuit for supplying the reference pulse to said first counter means in response to the enabling signal of said set switch.

6. The coffee maker according to claim 1, wherein said operation start means includes a start switch for supplying an operation start signal, and means for storing operation start data in accordance with the operation start signal provided that neither said motor driving means nor said heater controlling means is operative.

7. The coffee maker according to claim 6, wherein said storing means includes gate means for producing trigger signal in response to the operation start signal, provided that neither said motor driving nor said heater controlling means is operative, and a flip-flop circuit for storing the operation start data upon receipt of the trigger signal from said gate means.

8. The coffee maker according to claim 1, wherein said transfer gate means includes means for storing operation start data in accordance with the operation start signal supplied from said operation start means upon receipt of the output signal of said detecting means which indicates that said main switch is in the on-state, means for producing a trigger signal when said storing means stores the operation start data, and a transfer gate for transferring the mill time data stored in said first counter means to said second counter means in accordance with the trigger signal.

9. The coffee maker according to claim 8, wherein said storing means includes a flip-flop circuit, said trigger producing means includes a monostable multivibrator, and said transfer gate has a control terminal for receiving the trigger signal.

10. The coffee maker according to claim 1, wherein said signaling means includes a pulse generator for producing a pulse with a predetermined pulse width when said detecting means detects that said thermal switch has sensed a predetermined temperature of said heater, and buzzer means for signaling termination of the drip operation.

11. The coffee maker according to claim 10, wherein said pulse generator includes a flip-flop circuit for storing that said detecting means detects that said thermal switch has sensed a predetermined temperature of said heater, and a monostable multivibrator for producing the pulse in response to the output signal of said flip-flop circuit, and said buzzer means includes a buzzer drive circuit and a buzzer.

12. The coffee maker according to claim 1, further including operation stop means for reseting said operation start means, said transfer gate means, and said signaling means.

13. The coffee maker according to claim 1, wherein said operation start means includes a start switch for producing an operation start signal and a first flip-flop circuit for storing operation start data in accordance with the operation start signal; said transfer gate means includes a second flip-flop circuit for storing the operation start data supplied from said first flip-flop circuit upon receipt of the output signal of said detecting means which indicates that said main switch is in the on-state, means for producing a trigger signal when said second flip-flop circuit stores the operation start data, and a transfer gate for transferring the mill time data stored in said first counter means to said second counter means; and said signaling means includes a third flip-flop circuit for storing that said detecting means detects that said thermal switch has sensed a predetermined temperature of said heater, and a monostable multivibrator for producing a pulse with a predetermined pulse width.

14. The coffee maker according to claim 13, further including a stop switch for providing a reset signal to said first, second and third flip-flop circuits.

15. The coffee maker according to claim 1, including means for displaying the contents of said first counter means and the off-state of said main switch.

16. The coffee maker according to claim 15, wherein said displaying means includes means for storing data of the off-state of said main switch, digital display unit, and means for transferring only the data stored in said storing means to said displaying unit when said detecting means detects that said main switch is in the off-state after said operation start means is operative.

17. A coffee maker comprising:
a mill mechanism for milling coffee beans into coffee powder, said mill mechanism including a case for containing the coffee beans, a cutter disposed in said case, and a motor coupled to said cutter;
a drip mechanism for pouring hot water into the coffee powder in said case, said drip mechanism including an electric heater;
switching means for controlling the energization of said heater, said switching means including a main switch, a thermal switch for sensing the temperature of said heater, and a heater switch, said main switch, said heater of said drip mechanism, said thermal switch, and said heater constituting a series circuit connected with a power source;
means for generating a reference pulse;
first counter means for counting the reference pulse and storing a mill time data for said mill mechanism;
setting means for providing said first counter means with the reference pulse so as to set the mill time data in said first counter means;
second counter means for counting the reference pulse during a period of time corresponding to the mill time data;
a start switch for producing an operation start data;
a first flip-flop circuit for storing the operation start data;
means for detecting the on-off states of said main switch and thermal switch;
a second flip-flop circuit for storing the operation start signal transferred from said first flip-flop circuit;
gate means for transferring the operation start signal stored in said first flip-flop to said second flip-flop circuit in response to the output signal of said detecting means which indicates that main switch is in the on-state;
means for producing a trigger pulse when said second flip-flop circuit stores the operation start data;
a transfer gate for transferring the mill time data stored in said first counter means to said second counter means in accordance with the trigger signal;
means for driving said motor of said mill mechanism in response to the output signal of said second counter means;

means for controlling the on-off states of said heater switch in accordance with the output signals of said second counter means and said second flip-flop circuit;

means for signaling termination of the drip operation of said drip mechanism when said detecting means detects that said thermal switch has sensed a predetermined temperature of said heater;

means for selectively displaying the contents of said first counter means and the off-state of said main switch; and means for resetting said first and second flip-flop circuits and said signaling means.

18. The coffee maker according to claim 17, wherein said first counter means includes an up-counter and said second counter means includes a down-counter.

19. The coffee maker comprising a mill mechanism for milling coffee beans held in a case to provide coffee powder and a drip mechanism for pouring hot water into the coffee powder to make coffee:

a heater circuit with a series circuit connected across an AC power source and including a main switch, a heater contained in said drip mechanism, a normally closed thermal switch which is turned off when the temperature of said heater exceeds a given value, and a heater switch for said heater which is turned on after said main switch is turned on; and a detecting circuit connected with a signal take-out node of a given end of said series circuit and for detecting that said main switch is ON and at least one of said thermal switch and said heater switch is OFF.

20. The coffee maker according to claim 19, wherein said control apparatus further comprises a DC power source of a rectifier circuit connected across said AC power source for supplying a drive DC voltage to said detecting circuit, and wherein said detecting circuit includes a bipolar transistor of which the emitter-collector path is connected between a lower voltage output line of said DC power source and one end of said AC power source through a collector resistor, said transistor being connected at the base electrode to said one end of said AC power source through a base resistor to the signal take-out node of a series circuit including said thermal switch and said heater switch for said heater, said detection signal being taken out from the collector electrode of said transistor.

* * * * *